United States Patent
Suzuki

(10) Patent No.: US 6,707,412 B2
(45) Date of Patent: Mar. 16, 2004

(54) A/D CONVERTER CIRCUIT

(75) Inventor: Hisao Suzuki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/261,674

(22) Filed: Oct. 2, 2002

(65) Prior Publication Data

US 2003/0184465 A1 Oct. 2, 2003

(30) Foreign Application Priority Data

Mar. 29, 2002 (JP) ........................................ 2002-093878

(51) Int. Cl.[7] ............................. H03M 1/12; H03M 1/78
(52) U.S. Cl. ......................................... 341/156; 341/154
(58) Field of Search ................................ 341/156, 150, 341/172, 155, 158, 154; 327/63, 94

(56) References Cited

U.S. PATENT DOCUMENTS

| | | | |
|---|---|---|---|
| 4,794,374 A | | 12/1988 | Koike |
| 5,534,864 A | * | 7/1996 | Ono et al. ................... 341/156 |
| 5,675,340 A | * | 10/1997 | Hester et al. ................ 341/156 |
| 5,936,437 A | * | 8/1999 | Kusumoto et al. ............ 327/94 |
| 5,986,599 A | * | 11/1999 | Matsuo ....................... 341/158 |
| 6,054,945 A | * | 4/2000 | Doyle ......................... 341/150 |
| 6,064,239 A | * | 5/2000 | Matsuoka ..................... 327/63 |
| 6,313,779 B1 | * | 11/2001 | Leung et al. ................ 341/155 |
| 6,563,446 B1 | * | 5/2003 | Sutardja ..................... 341/120 |

* cited by examiner

*Primary Examiner*—Patrick Wamsley
(74) *Attorney, Agent, or Firm*—Arent Fox Kintner Plotkin & Kahn, PLLC

(57) ABSTRACT

There is provided an A/D converter circuit capable of high-speed operation without fluctuation of reference voltage due to comparison operation by high-order comparators influencing voltage level of reference voltage of voltage comparison by low-order comparators. First switches SW11A, SW12A, and SW13A and second switches SW11B, SW12B, and SW13B are arranged between reference voltage terminals (REF) of high-order comparators COMP 11, 12, and 13 and voltage-divided terminals (N1), (N2), and (N3) of ladder-resistance-element array, respectively. Voltage holding capacitance elements C11, C12, and C13 are connected to connection points between the first switches SW11A, SW12A, and SW13A and the second switches SW11B, SW12B, and SW13B. When input voltage VAIN is fetched, the first switches SW11A, SW12A, and SW13A are turned on so as to fetch high-order reference voltage VN1, VN2, and VN3 to the voltage holding capacitance elements C11, C12, and C13. The first switches SW11A, SW12A, and SW13A are turned off whereas the second switches SW11B, SW12B, and SW13B turned so that high-order-reference voltages VN1, VN2, and VN3 are supplied to the high-order comparators COM11, COMP12, and COMP13 for voltage comparison operation.

13 Claims, 10 Drawing Sheets

A/D CONVERTER DIRECTED TO PRESENT EMBODIMENT

A/D CONVERTER DIRECTED TO PRESENT EMBODIMENT

SPECIFIC EXAMPLE OF COMPARATOR

TABLE OF COMPARATOR'S OPERATION STATE

| COMPARATOR'S OPERATION STATE | SWA | SWB | SWC |
|---|---|---|---|
| (I) FETCH VOLTAGE | ON | OFF | ON |
| (II) HOLD FETCHED VOLTAGE | OFF | OFF | OFF |
| (III) COMPARE VOLTAGES | OFF | ON | OFF |

HIGH-ORDER-COMPARATOR CONTROL CIRCUIT

LOW-ORDER-COMPARATOR CONTROL CIRCUIT

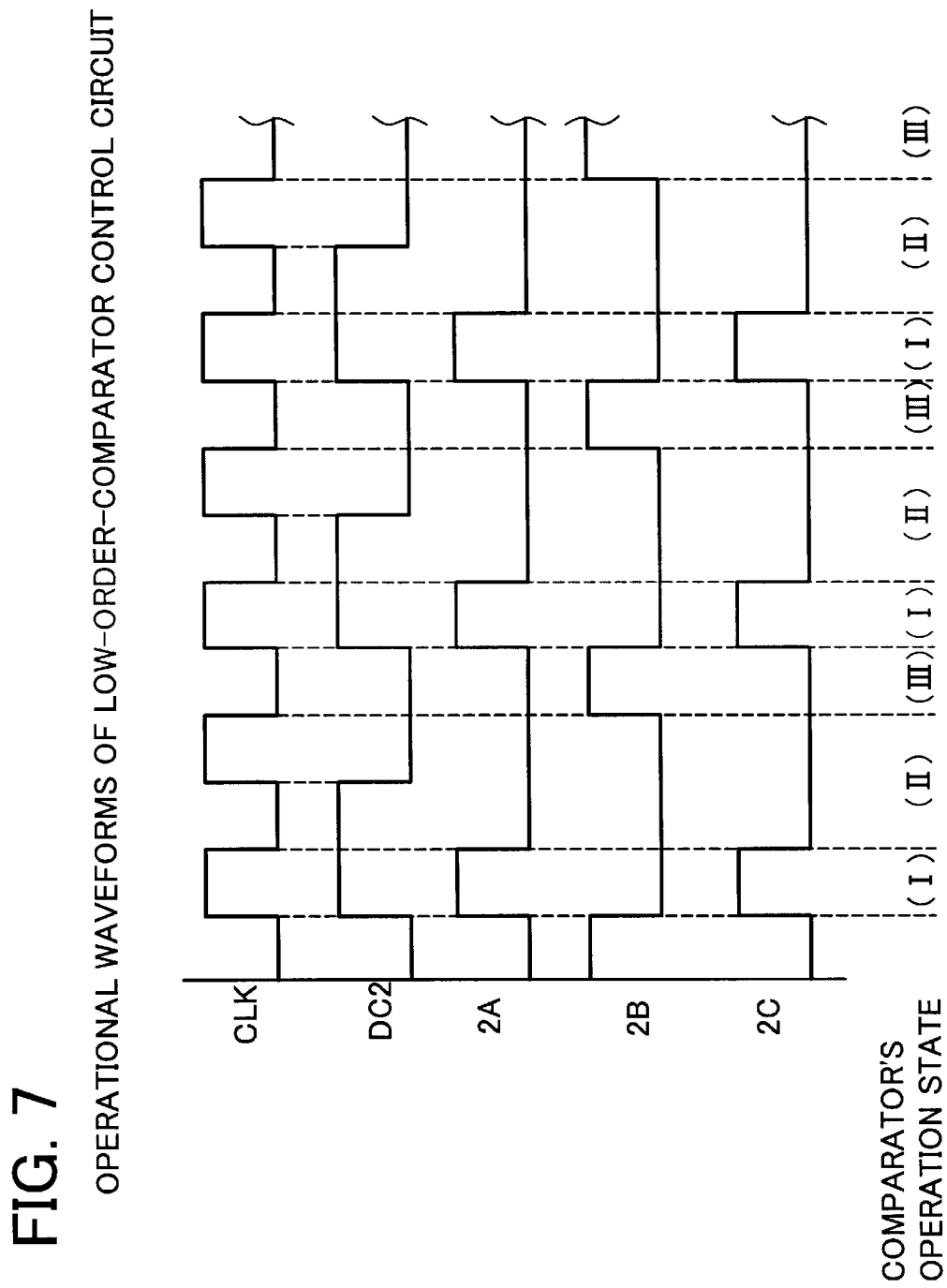
FIG. 7 OPERATIONAL WAVEFORMS OF LOW-ORDER-COMPARATOR CONTROL CIRCUIT

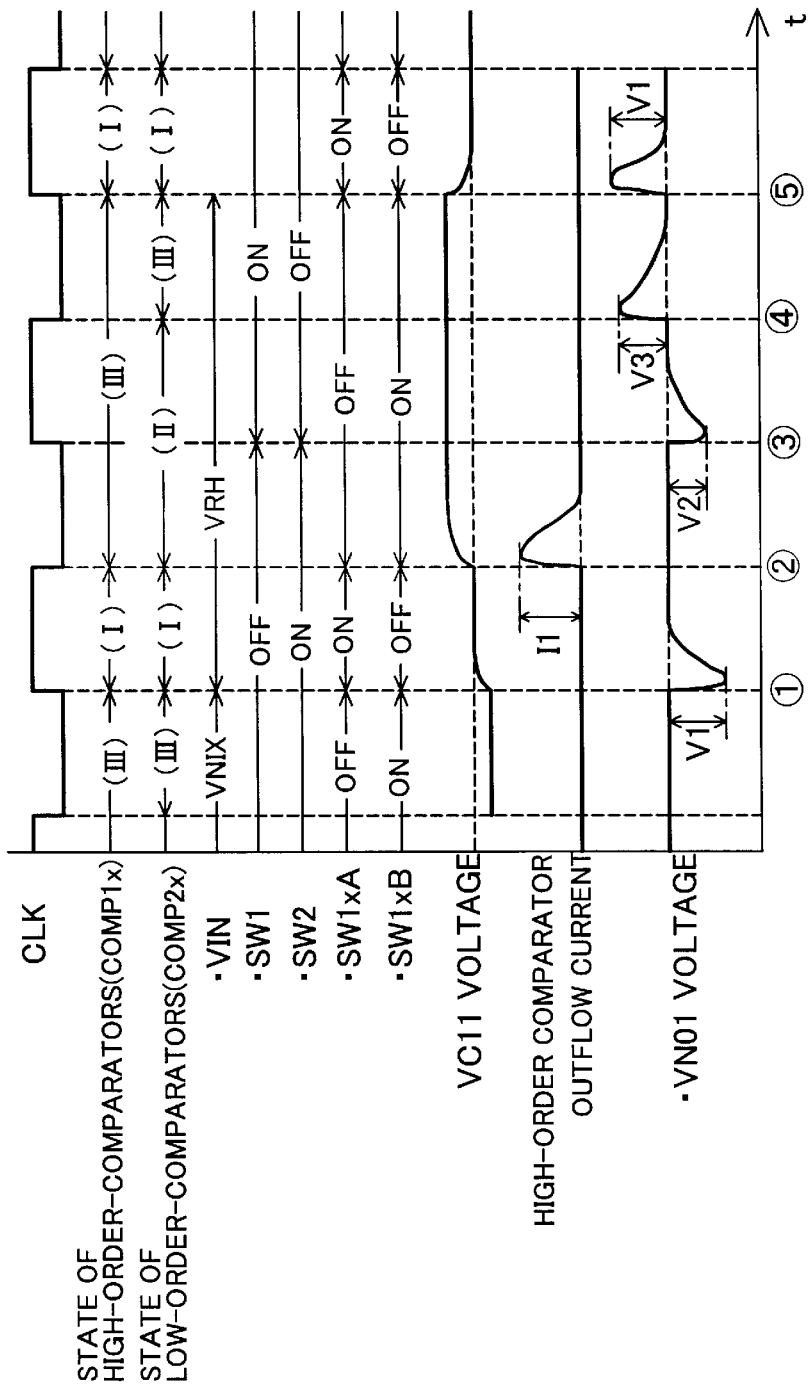
FIG. 8 OPERATIONAL WAVEFORMS OF A/D CONVERTER DIRECTED TO PRESENT EMBODIMENT

FIG. 9

CONVERSION TABLE OF A/D CONVERTER DIRECTED TO PRESENT EMBODIMENT

| VIN (B/W VRH − VRL) | COMP1x | | | SW SELECTION | | | | COMP2x | | | OUTPUT CODE |
|---|---|---|---|---|---|---|---|---|---|---|---|
| | O11 | O12 | O13 | S1 | S2 | S3 | S4 | O21 | O22 | O23 | |
| VN01 ≦ VIN < VRH | Hi | Hi | Hi | ON | OFF | OFF | OFF | Hi | Hi | Hi | 15 |
| VN02 ≦ VIN < VN01 | Hi | Hi | Hi | ON | OFF | OFF | OFF | Lo | Hi | Hi | 14 |
| VN03 ≦ VIN < VN02 | Hi | Hi | Hi | ON | OFF | OFF | OFF | Lo | Lo | Hi | 13 |
| VN1 ≦ VIN < VN03 | Hi | Hi | Hi | ON | OFF | OFF | OFF | Lo | Lo | Lo | 12 |
| VN11 ≦ VIN < VN1 | Lo | Hi | Hi | OFF | ON | OFF | OFF | Hi | Hi | Hi | 11 |
| VN12 ≦ VIN < VN11 | Lo | Lo | Hi | OFF | ON | OFF | OFF | Lo | Hi | Hi | 10 |
| VN13 ≦ VIN < VN12 | Lo | Lo | Hi | OFF | ON | OFF | OFF | Lo | Lo | Hi | 9 |
| VN2 ≦ VIN < VN13 | Lo | Lo | Hi | OFF | ON | OFF | OFF | Lo | Lo | Lo | 8 |
| VN21 ≦ VIN < VN2 | Lo | Lo | Hi | OFF | OFF | ON | OFF | Hi | Hi | Hi | 7 |
| VN22 ≦ VIN < VN21 | Lo | Lo | Hi | OFF | OFF | ON | OFF | Lo | Hi | Hi | 6 |
| VN23 ≦ VIN < VN22 | Lo | Lo | Hi | OFF | OFF | ON | OFF | Lo | Lo | Hi | 5 |
| VN3 ≦ VIN < VN23 | Lo | Lo | Hi | OFF | OFF | ON | OFF | Lo | Lo | Lo | 4 |
| VN31 ≦ VIN < VN3 | Lo | Lo | Lo | OFF | OFF | OFF | ON | Hi | Hi | Hi | 3 |
| VN32 ≦ VIN < VN31 | Lo | Lo | Lo | OFF | OFF | OFF | ON | Lo | Hi | Hi | 2 |
| VN33 ≦ VIN < VN32 | Lo | Lo | Lo | OFF | OFF | OFF | ON | Lo | Lo | Hi | 1 |
| VRL ≦ VIN < VN33 | Lo | Lo | Lo | OFF | OFF | OFF | ON | Lo | Lo | Lo | 0 |

CONVENTIONAL A/D CONVERTER

OPERATIONAL WAVEFORMS OF CONVENTIONAL A/D CONVERTER

A/D CONVERTER CIRCUIT

CROSS-REFERENCE TO RELATED APPLICATIONS

This application is based on application No. 2002-93878 filed in Japan, the contents of which is hereby incorporated by reference.

BACKGROUND OF THE INVENTION

1. Field of the Invention

The present invention relates to high-speed operation of an A/D converter circuit.

2. Description of Related Art

FIG. 10 shows a conventional A/D converter, more precisely, it is a four-bit output type series-parallel A/D converter. The A/D converter includes: high-order comparators COMP11, 12, and 13 controlled by control signals 1A, 1B, and 1C, outputted from a high-order-comparator control circuit 10; and low-order comparators COMP21, 22, and 23 controlled by control signals 2A, 2B, and 2C outputted from a low-order-comparator control circuit 20. Input terminals (IN) of respective comparators COMP11, 12 and 13, COMP21, 22, and 23 are connected to an input terminal (AIN) of the A/D converter. To reference voltage terminals of the respective comparators, there are appropriately selected and inputted various levels of voltage obtained by dividing input voltage range of analog-input voltage VAIN (maximum reference voltage: VRH, minimum reference voltage: VRL) into sixteen by a ladder-resistance-element array.

The reference voltage terminals (REF) of the high-order comparators 11, 12, and 13 are connected to voltage-divided terminals (N1), (N2), and (N3), respectively, obtained by dividing the input voltage range of the analog-input voltage VAIN into four by the ladder-resistance-element array. At the time of A/D conversion, firstly, voltage level of the analog-input voltage VAIN is roughly detected and A/D conversion of high-order bits is conducted. Output terminals (011), (012), and (013) are connected to a switch selecting circuit 30. From the switch selecting circuit 30, there is selectively inputted any one of switch control signals S1 through S4 depending on an A/D conversion result of high-order bits.

The reference voltage terminals (REF) of the low-order comparators COMP21, 22, and 23 are connected to voltage-divided terminals of the ladder-resistance-element array through a change-over switch groups SW1 through SW4. The change-over switch groups SW1 through SW4 are alternatively selected in accordance with types of switch control signals S1 through S4. Thereby, low-order reference voltage of the low-order comparators COMP21, 22, and 23 is determined. That is, in case the analog-input voltage VAIN is same as or higher than high-order reference voltage VN1 at a voltage-divided terminal of the ladder-resistance-element array, the change-over switch group SW1 is selected and low-order reference voltages VN01, VN02, and VN03 are inputted to the reference voltage terminals of the comparators COM21, 22, and 23, respectively. It should be noted that, in the precedent passage and following passages, voltage level of each voltage-divided terminal is indicated with a prefix "V" to a name of a voltage-divided terminal. Similar to the above case, in case the analog-input voltage VAIN is same as or higher than high-order reference voltage VN2 and lower than VN1, the change-over switch group SW2 is selected and low-order reference voltages VN11, VN12, and VN13 are inputted. In case the analog-input voltage VAIN is same as or higher than high-order reference voltage VN3 and lower than VN2, the change-over switch group SW3 is selected and low-order reference voltages VN21, VN22, and VN23 are inputted. In case the analog-input voltage VAIN is lower than VN3, the change-over switch group SW4 is selected and low-order reference voltages VN31, VN32, and VN33 are inputted.

A four-bit output can be obtained with the following manner. That is, bits of an output is divided into high-order bits and low-order bits and then, logic level of outputs 011, 012, 013, 021, 022, and 023 from the comparators COMP11, 12, and 13, and the comparators COMP21, 22, and 23, respectively, are encoded.

FIG. 11 shows operational waveforms. The A/D converter of FIG. 10 operates in synchronous with a clock signal CLK. The A/D converter takes a (½)-period of a clock signal CLK as a time step for its operation. Three operation states, namely, fetch operation of the analog input voltage VAIN (I), holding operation of the fetched voltage (II), and voltage comparison operation (III) are switched every time step. Time steps ① through ⑤ make an operation unit and A/D conversion operation is conducted.

During a time step ①–②, a high-order comparator COMP1x (x=1, 2, and 3, same as the following descriptions) and a low-order comparator COMP2x fetch the analog-input voltage VAIN (operation (I)). Voltage level fetched at this time step shifts to maximum voltage level VRH from voltage level VN1X that is same as or higher than high-order reference voltage VN2 at a terminal (N2) of the ladder-resistance-element array and lower than high-order reference voltage VN1 at the terminal N1. Capacitance components with respect to internal terminals of the comparators COMP1x and COMP2x are charged up to voltage level VRH for the analog-input voltage VAIN.

Next, during a time step ②–③, each of the low-order comparators COMP2x holds voltage level VRH (operation (II)), and each of the high-order comparators COMP1x shifts to comparison state (operation (III)). Voltage level at internal terminals of respective high-order comparators COMP1x makes transitions from the maximum voltage level VRH to respective high-order reference voltage VNx (x=1, 2, and 3, same as the following descriptions) through the reference voltage terminals (REF). As a result, from the reference voltage terminals (REF) of respective high-order comparators COMP1x, there flows current due to charge and discharge from the capacitance components of the internal terminals. FIG. 11 shows a case of the high-order comparator COMP11. Outflow current of peak current 1100 flows out due to discharge. The outflow current flows toward a terminal (RL) in the ladder-resistance-element array. Therefore, voltage rise in proportion to outflow current reflects level of the low-order reference voltage VN01 at the voltage divided terminal (N01) as amount of voltage fluctuation. It is assumed that peak voltage corresponding to the amount of voltage fluctuation is V100.

Next, during a time step ③–④, low-order reference voltage is set prior to comparison operation of respective low-order comparators COMP2x. Based on comparison results of respective high-order comparators COMP1x, a change-over switch group to be determined by the switch selecting circuit 30 is selected. In case of FIG. 11, change-over switch groups are changed from the change-over switch group SW2 for voltage level VN1X at a precedent cycle to the changeover switch group SW1 suitable to voltage level VRH. Due to changeover of the switch groups, capacitance components Cp1, Cp2, and Cp3 between each of the change-over switch groups SW1 through SW4 and each of the low-order comparator COMP2x are charged, whereby terminal voltage makes transition from voltage level VN1 to VRH. At this stage, current is supplied from a terminal (RH). Consequently, low-order reference voltage VN01 at the voltage-divided terminal (N01) is heightened. It is assumed that an amount of voltage fluctuation at this stage is V2. It should be noted that the capacitance components Cp1, Cp2, and Cp3 are equivalent to a sum of parasitic capacitance components obtained at each of the change-over switch groups SW1 through SW4, each of the low-order comparators COMP2x, and wirings.

Further on, during a time step ④–⑤, each of the high-order comparators COMP1x keeps comparison state (operation (III)) and the each of the low-order comparators COMP2x shifts to comparison state (operation (III)). Internal terminals of respective low-order comparators COMP2x at this stage work in a same manner as those of respective high-order comparators COMP1x at the time step ②–③. That is, voltage level at internal terminals of respective low-order comparators COMP2x makes transition from the maximum voltage level VRH to respective low-order reference voltage VN0x (x=1, 2, and 3, same as the following descriptions) through the reference voltage terminals (REF). Since a width of transiting voltage at the time step ④–⑤ is narrower than at the time step ②–③, an amount of voltage fluctuation from a set value of peak voltage is V3 (<V100).

Not to mention, though FIG. 11 shows voltage-level transition of the low-order reference voltage VN01 only as an example, voltage level of the other low-order reference voltage VNO2 and VNO3 makes transition in a same manner as VNO1.

However, in the conventional A/D converter, each of the high-order comparators COMP1x keeps comparison state and each of the high-order reference voltages VNx is supplied to each of corresponding reference voltage terminals (REF) during a time step of ②–⑤. Electric current is charged/discharged until voltage level at the internal terminals of the high-order comparators COMP1x makes transition from voltage level of the analog-input voltage VAIN fetched at the time step ①–② to respective high-order reference voltages VNx. Voltage transition at the internal terminals at this stage may be almost full-wide voltage transition between the maximum voltage level VRH and the minimum voltage level VRL within a input voltage range though it depends on voltage level of the analog-input voltage VAIN.

Therefore, as shown in FIG. 11, there may be a case that voltage transition of the internal terminals does not finish within a time step ②–③. In that case, due to outflow current from the reference voltage terminals (REF) caused by the voltage transition of the internal terminals (i.e., in case voltage level of fetched analog-input voltage VAIN is higher than the high-order reference voltage VNx), voltage levels of respective high-order and low-order reference voltages, set by the ladder-resistance-element array, deviate from their respective set values in time steps after time ③. Deviation of the reference voltage caused by comparison operation of the respective high-order comparators COMP1x may remain at subsequent state, i.e., comparison state of the respective low-order comparators COMP2x (time step ④–⑤) without being cleared. As a result, at the respective low-order comparators COMP2x, comparison operation is conducted with low-order reference voltage deviating from set value. With comparison operation as such, accurate voltage comparison results cannot be obtained, which is problematic.

As oscillation frequencies of clock signal CLK to operate the conventional A/D converter are generated faster, deviation voltage values turns out more apparent. Therefore, under the trend that higher-speed operation is sought for A/D converters, conversion errors such as the conventional A/D converter become a much more serious problem.

SUMMARY OF THE INVENTION

The present invention is made to solve the above-mentioned problem. Accordingly, it is an object of the present invention to provide an A/D converter circuit capable of high-speed operation without fluctuation of high-order reference voltage caused by comparison operation of high-order comparators influencing on voltage level of low-order reference voltage at the time of comparison operation of low-order comparators.

To achieve the object, according to one aspect of the present invention, there is provided an A/D converter circuit comprising: one or more voltage comparators for conducting A/D conversion; and a resistance-component-element array for generating respective reference voltage(s) for the respective voltage comparator(s) at each voltage-divided terminal of the resistance-component-element array; wherein the A/D converter circuit further includes reference voltage holding section(s) for holding the respective reference voltage(s) supplied from each voltage-divided terminal and supplies the respective reference voltage(s) held thereat to the respective voltage comparator(s) after each of the voltage-divided terminal(s) is electrically separated from the respective reference voltage holding section(s)

In the A/D converter circuit according to the one aspect of the present invention, the respective reference voltage(s) is/are generated at each voltage-divided terminal of the resistance-component-element array as reference voltage(s) for the respective voltage comparator(s). The respective reference voltage(s) is/are firstly supplied to the respective reference voltage holding section and held there. After that, the respective reference voltage holding section(s) is/are separated from each of the voltage-divided terminal(s) and the respective reference voltage(s) held is/are supplied from the respective reference voltage holding section(s) to the respective voltage comparator(s).

While reference voltage(s) generated at the each voltage-divided terminal of the resistance-component-element array is/are supplied to and held at the respective reference voltage holding section(s), reference voltage(s) to be supplied to the voltage comparator(s) can be supplied to the voltage comparator(s) from the reference voltage holding section(s) after the each voltage divided terminal is separated from the reference voltage holding section(s). Accordingly, voltage fluctuation never occurs to voltage-divided terminals of the resistance-component-element array when reference voltage (s) is/are supplied to the voltage comparator(s).

Furthermore, according to another aspect of the present invention, there is provided an A/D converter circuit comprising: one or more high-order-bit-discrimination voltage comparators for conducting A/D conversion of high-order bits prior to A/D conversion of low-order bits; and a resistance-component-element array for generating each high-order reference voltage for A/D conversion of each of the high-order bits at each high-order-voltage-divided terminal, and each low-order reference voltage for A/D conversion of each of the low-order bits at each low-ordervoltage-divided terminal, the resistance-component-element array being connected between high-voltage-side reference voltage and low-voltage-side reference voltage; wherein the A/D converter circuit further includes each reference voltage holding section for holding each high-order reference voltage supplied from each high-order voltage-divided terminal and supplies each high-order reference voltage held thereat to each high-order-bit-discrimination voltage comparator after each high-order-voltage-divided terminal is electrically separated from the each reference voltage holding section.

In the A/D converter circuit according to another aspect of the present invention, each high-order reference voltage is generated at each high-order-voltage-divided terminal of the resistance-component-element array as reference voltage for each high-order-bit-discrimination voltage comparator. Each high-order reference voltage is firstly supplied to each reference voltage holding section and held there. After that, each reference voltage holding section is separated from each high-order-voltage-divided terminal and each high-order-reference voltage held is supplied from each reference voltage holding section to each high-order-bit-discrimination voltage comparator(s).

While high-order reference voltage generated at the high-order-voltage-divided terminal of the resistance-component-element array is supplied to and held at the reference voltage holding section, high-order-reference voltage to be supplied to the high-order-bit-discrimination voltage comparator(s) can be supplied to the high-order-bit-discrimination voltage comparator(s) from the reference voltage holding section after the high-order-voltage-divided terminal is separated from the reference holding section. Accordingly, voltage fluctuation never occurs to a high-order-voltage-divided terminal of the resistance-component-element array when high-order reference voltage is supplied to the high-order-bit-discrimination voltage comparator(s). Furthermore, at the time of A/D conversion of low-order bits, conducted in subsequent to high-order bits, voltage fluctuation never remains in low-order reference voltage. That is, there can be eliminated influences due to A/D conversion of high-order bits at the time of A/D conversion of low-order bits.

Furthermore, there is no need to take time for relaxation of voltage fluctuation with respect to high-order reference voltage at the high-order-divided-voltage terminal of the resistance-component-element array. Accordingly, there is no need to set unnecessary relaxation time between A/D conversion of high-order bits and A/D conversion of low-order bits. High-speed operation thus can be achieved.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 7 shows operational waveforms of a low-order-comparator control circuit;

FIG. 8 shows operational waveforms of an A/D converter directed to the present embodiment;

FIG. 9 shows a conversion table of the A/D converter directed to the present embodiment;

DETAILED DESCRIPTION OF THE PREFERRED EMBODIMENTS

Preferred embodiments of an A/D converter circuit according to the present invention will be described in detail below with reference to FIG. 1 through FIG. 9.

Figure 1:
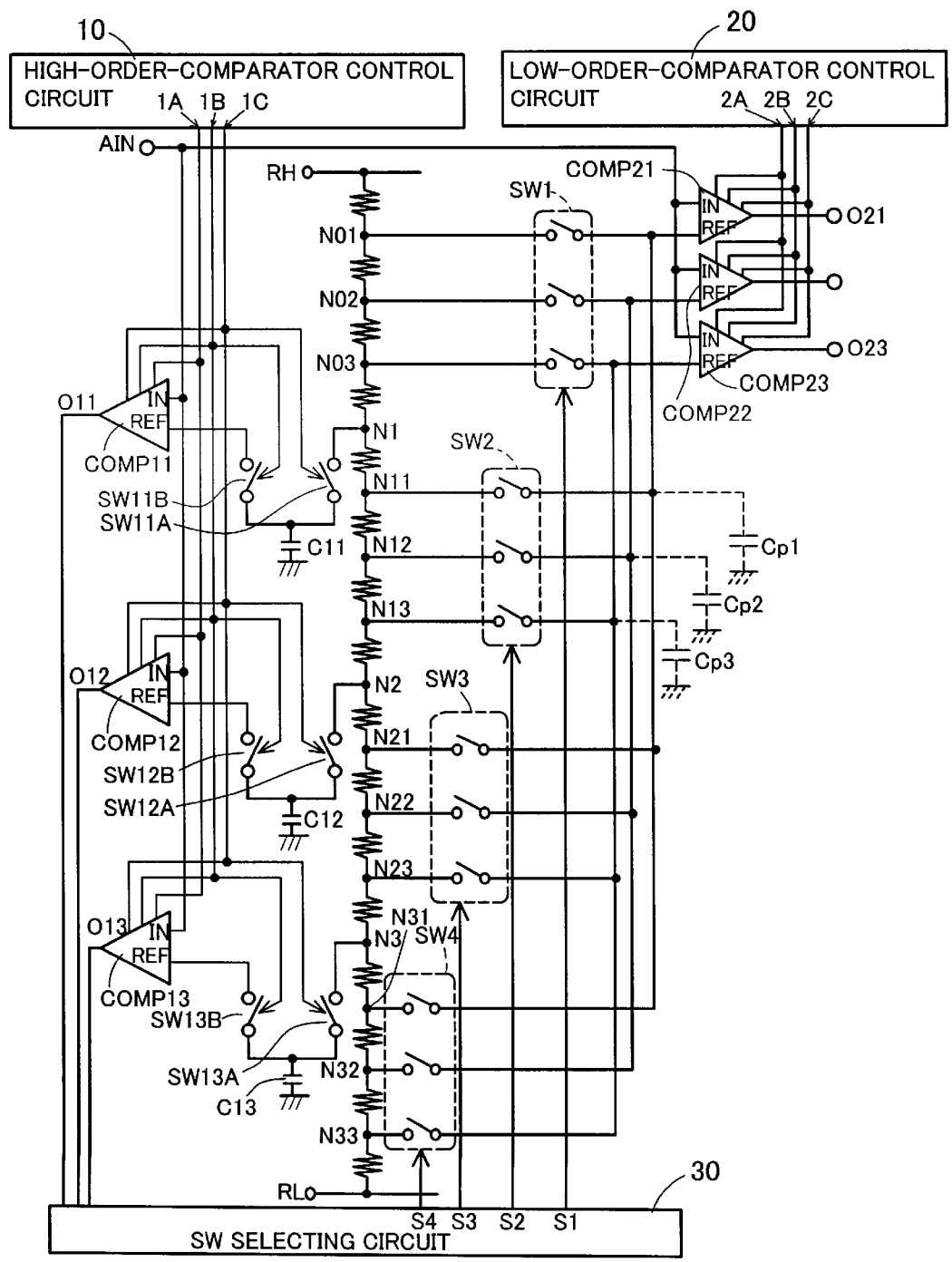
FIG. 1 is a circuit diagram showing an A/D converter directed to the present embodiment.
Figure 10:
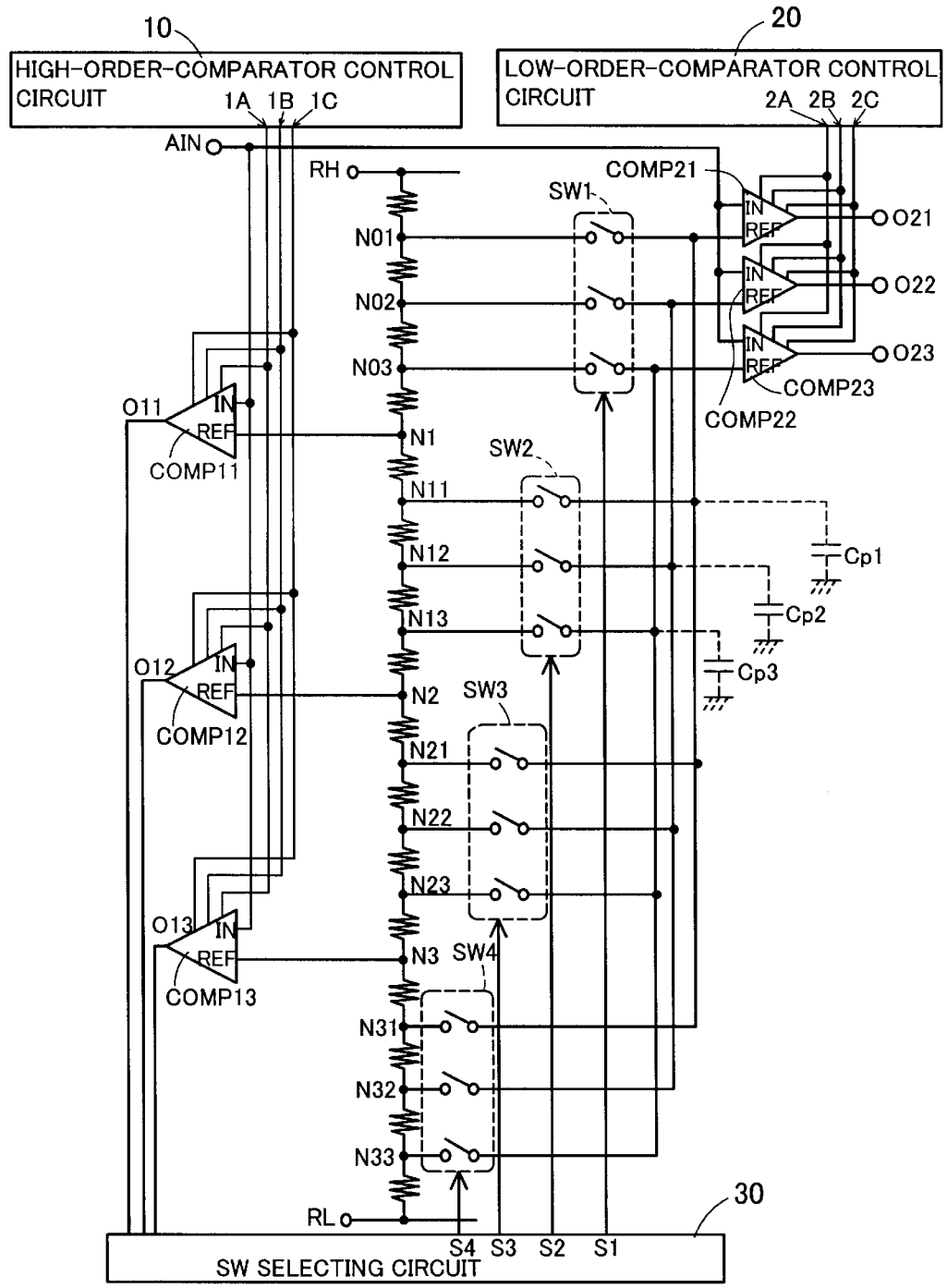
FIG. 10 is a circuit diagram showing a conventional A/D converter.

FIG. 1 shows a four-bit output type series-parallel A/D converter. With respect to the conventional four-bit output type series-parallel A/D converter (FIG. 10), the reference voltage terminals (REF) of the high-order comparators COMP 11, 12, and 13 are directly connected to the voltage-divided terminals (N1), (N2), and (N3), respectively. However, in the inventive A/D converter, its voltage-divided terminals (N1), (N2), and (N3) are connected to reference voltage terminals (REF) of high-order comparators COMP 11, 12, and 13, respectively through first switches SW11A, SW12A, and SW13A and second switches SW11B, SW12B, and SW13B. One of the two terminals of respective voltage holding capacitance elements C11, C12, and C13 are connected to connection points of (SW11A, SW11B), (SW12A, SW12B), (SW13A, SW13B), respectively, and the other terminals of them are connected to ground voltage.

Control signals 1C and 1B outputted from a high-order-comparator control circuit 10 control conductivity of the first switches SW11A, SW12A, and SW13A and the second switches SW11B, SW12B, and SW13B.

Figures 2, 3:
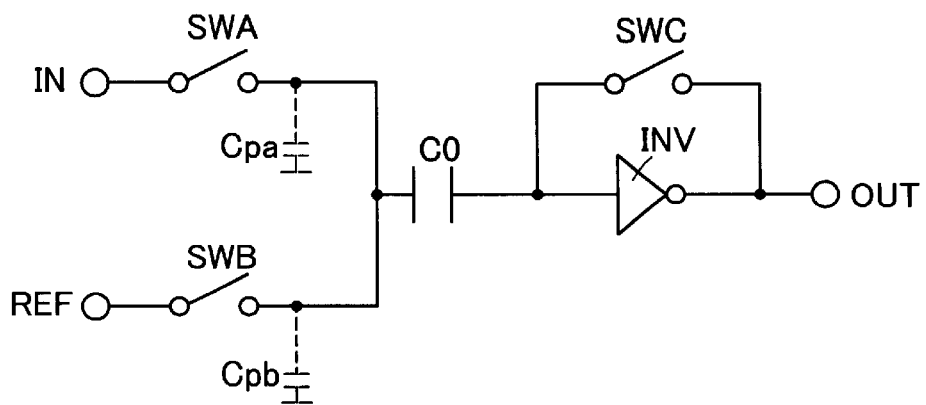
FIG. 2 is a circuit diagram showing a specific example of a comparator.
FIG. 3 is a table of comparator's operation state.

FIG. 2 shows a specific example of a high-order comparator. This is so-called a chopper-type comparator. An input terminal (IN) and a reference voltage terminals (REF) are connected to switches SWA and SWB, respectively. Both of the other terminals of the switches SWA and SWB are connected to one of the terminals of a voltage-comparison capacitance element C0. The other terminal of it is connected to an input terminal of an inverter gate INV and a voltage comparison result is outputted from an output terminal (OUT) of the inverter gate INV. One of the terminals of a switch SWC is connected between the voltage-comparison capacitance element C0 and the input terminal of an inverter gate INV, and the other terminal is connected between the output terminal of the inverter gate INV and the output terminal (OUT). It should be noted that there accompany parasitic capacitance elements due to element structure to the switches SWA, SWB, in general. In FIG. 2, those parasitic capacitance components are indicated as parasitic capacitance Cpa, Cpb.

Voltage comparison operation by the comparator of FIG. 2 will be described by referring to a table shown in FIG. 3. As shown in FIG. 3, this comparator has three operation states depending on conductive states of switches SWA, SWB, and SWC. That is, voltage comparison operation is conducted in accordance with time series as follows: (I) fetch operation for fetching analog voltage to the input terminal (IN); (II) hold operation for holding the fetched analog voltage; and (III) voltage comparison operation.

During fetch operation (I), the switches SWA and SWC are conductive state ("ON"), whereas the switch SWB is non-conductive state ("OFF"). Analog voltage is fetched to one of the terminals of the voltage-comparison capacitance element C0 from the input terminal (IN), through the switch SWA. Since the switch SWC is in conductive state ("ON") and the input terminal and output terminal (OUT) are short-circuited, these short-circuited terminals are biased to intermediate state of input/output characteristic of the inverter gate INV. That is, these terminals find balance around ½ of power source voltage VCC ((½) VCC voltage), threshold voltage of inverter gate INV. Accordingly, the other terminal of the voltage-comparison capacitance element C0 connected to the gate input terminal is biased to voltage of about (½) VCC. Electric charge in proportion to voltage difference between of about (½) VCC voltage and analog voltage is stored in the voltage-comparison capacitance element C0. Since parasitic capacitances Cpa and Cpb exist between one of the terminals of the voltage-comparison capacitance element C0 and ground voltage, electric charges are stored in the parasitic capacitances Cpa and Cpb.

Next, during hold operation (II), the switches SWA, SWB, and SWC are in non-conductive state ("OFF"). The voltage-comparison capacitance element C0 is in floating state and the analog voltage fetched during fetch operation is held as stored charges of the voltage-comparison capacitance element C0. Similarly, stored charges to the parasitic capacitances Cpa, Cpb are held.

To the analog voltage fetched and held through fetch operation (I) and hold operation (II), there is applied voltage difference between of about (½) VCC voltage and the analog voltage so as to store the voltage difference in the voltage-comparison capacitance element C0 as electric charge. There is further applied voltage difference between ground voltage and the analog voltage so as to store the voltage difference in the parasitic capacitances Cpa, and Cpb as electric charge.

Under such state, voltage comparison operation (III) is conducted. The switch SWB gets to be in conductive state ("ON") and the switch SWA gets to be in non-conductive state ("OFF"). Once reference voltage is supplied from the reference voltage terminals (REF) through the switch SWB, electric charges stored in the voltage-comparison capacitance element C0 and the parasitic capacitances Cpa and Cpb are charged or discharged depending on voltage difference against the analog voltage fetched or held.

In case supply source of reference voltage to be inputted to the reference voltage terminals (REF) is voltage source of the present embodiment (see FIG. 1), charge or discharge for the voltage-comparison capacitance element C0 and the parasitic capacitances Cpa and Cpb is continued until terminal voltage at the reference voltage terminals coincides with reference voltage, whereby electric charges required for charge or discharge is kept being supplied through the reference voltage terminals (REF). However, in case of the structure as shown FIG. 1, since supply sources to be inputted to the reference voltage terminals (REF) are voltage-holding capacitance elements C11, C12, and C13, supply of reference voltage is equivalent to electric charges required for charge distribution among the voltage-holding capacitance elements C11, C12, and C13, the voltage-comparison capacitance element C0 and the parasitic capacitances Cpa, and Cpb.

In case of the conventional A/D converter (FIG. 10), due to supply of reference voltage, voltage level at one of the two terminals of the voltage-comparison capacitance element C0 shifts from analog voltage to reference voltage. On the other hand, in case of the present embodiment (FIG. 1), the voltage level thereat shifts to voltage level obtained such that quantity of electric charges stored in the voltage-holding capacitance elements C11, C12, and C13 and the voltage-comparison capacitance element C0 or the like is distributed among them depending on capacitance values of respective elements. The voltage transition at the one of the two terminals of the voltage-comparison capacitance element C0 is transmitted to the other terminal of it due to capacitance coupling, whereby voltage level of the input terminal biased to threshold voltage of the inverter gate INV (of about (½) VCC voltage) shifts. The inverter gate INV receives this voltage transition to output a voltage comparison result from its output terminal (OUT).

That is, in case voltage level of analog voltage fetched or held is high compared with reference voltage, voltage level at the input terminal shifts to low voltage side when reference voltage is supplied. As a result, a voltage comparison result of high logic level is outputted from the output terminal (OUT). Vice versa, in case voltage level of analog voltage fetched or held is low compared with reference voltage, voltage level at the input terminal makes transition to high voltage side when reference voltage is supplied. As a result, a voltage comparison result of low logic level is outputted from the output terminal (OUT).

It should be noted that voltage at one of the two terminals of the voltage-comparison capacitance element C0 does not need shifting from analog voltage to reference voltage when reference voltage is supplied. That is, due to capacitance coupling at the voltage-comparison capacitance element C0, voltage transition is surely transmitted to the input terminal so that voltage at one terminal of it can surely make transition to predetermined voltage direction compared with the threshold voltage of the inverter gate INV (of about (½) VCC voltage), based on voltage difference between analog voltage and reference voltage. Since the input terminal is biased to the threshold voltage of the inverter gate INV (of about (½) VCC voltage) during fetch operation (I) or hold operation (II), prior to voltage comparison operation (III), a little voltage difference is enough for the inverter gate INV to detect voltage transition quantity. In the present embodiment, capacitance values of the voltage-holding capacitance elements C11, C12, and C13 can be set small.

Figure 4:
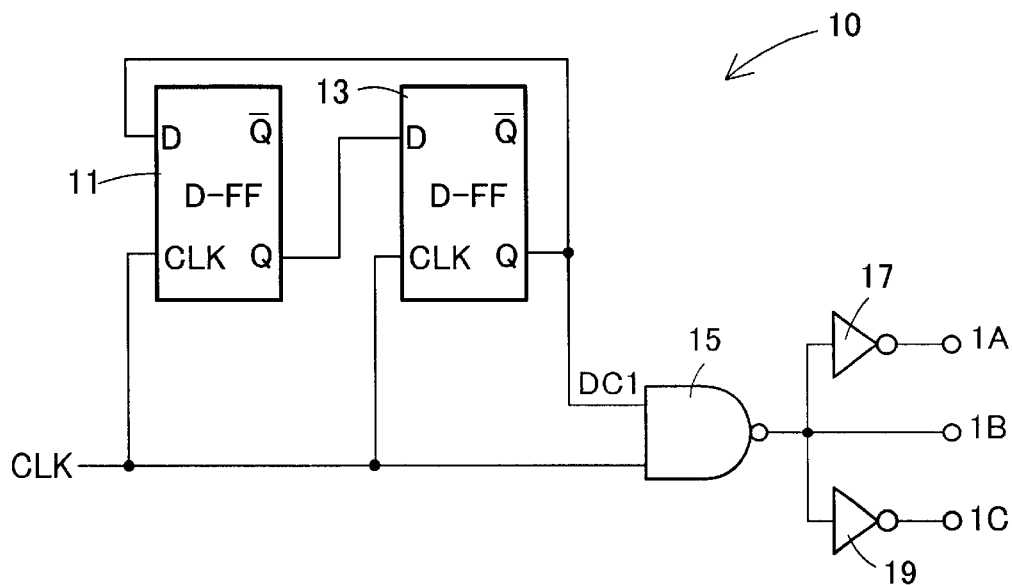
FIG. 4 is a circuit diagram showing a specific example of high-order-comparator control circuit.

FIG. 4 shows a specific example of a high-order-comparator control circuit 10. The high-order-comparator control circuit 10 includes two D-type flip-flops 11 and 13 clock signal terminals (CLK) of which receive inputs of clock signals CLK. A positive output terminal (Q) of the D-type flip-flop 11 is connected to an input terminal (D) of the D-type flip-flop 13 and a positive output terminal (Q) of the D-type flip-flop 13 is feedback to an input terminal (D) of the D-type flip-flop 11, whereby a dividing circuit is constituted. A divided signal DC1 from an output terminal (Q) and a clock signal CLK are inputted to a NAND gate 15 and then, a control signal 1B, a resultant signal of the above two signals, is outputted from there. Furthermore, the control signal 1B is inversed at inverter gates 17 and 19 and controls signals 1A and 1C are outputted from the inverter gates 17 and 19, respectively.

Figure 5:
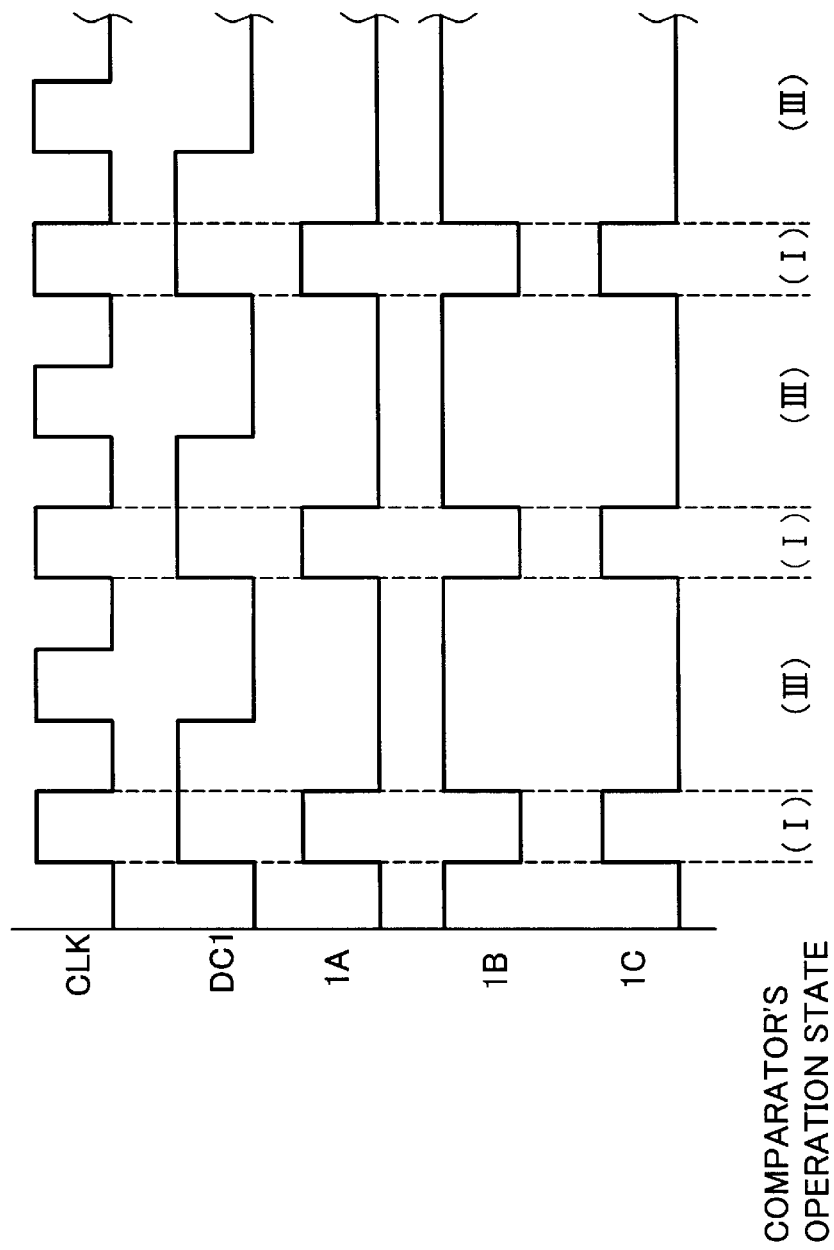
FIG. 5 shows operational waveforms of a high-order-comparator control circuit.

FIG. 5 shows operational waveforms of high-order-comparator control circuit 10. In the dividing circuit constituted by the two D-type flip-flops 11 and 13, logic level of an output signal DC1 makes transition along with rising edge of clock signal and there can be generated a divided signal cycle length of which is double of a clock signal CLK.

Due to NAND logic between a clock signal CLK and a divided signal DC1, control signal 1B in high logic level is outputted while the two signals CLK and DC1 are in high logic level. Control signals 1A and 1C are outputted as inversion signal of a control signal 1B. Control signals 1A, 1B, and 1C control the switches SWA, SWB, and SWC (see FIG. 2) of the high-order comparators COMP11, 12, ad 13, respectively, to set the switches conductive state ("ON") under high logic level condition. Accordingly, logic level of each control signal (1A, 1B, 1C) shows a state of (high, low, high) during fetch operation (I), and a state of (low, high, low) during voltage comparison operation (III). The high-order comparators COMP11, 12 and 13 are controlled under (½)-clock cycle state (I) and subsequent (3/2)-clock cycle state.

Figure 6:
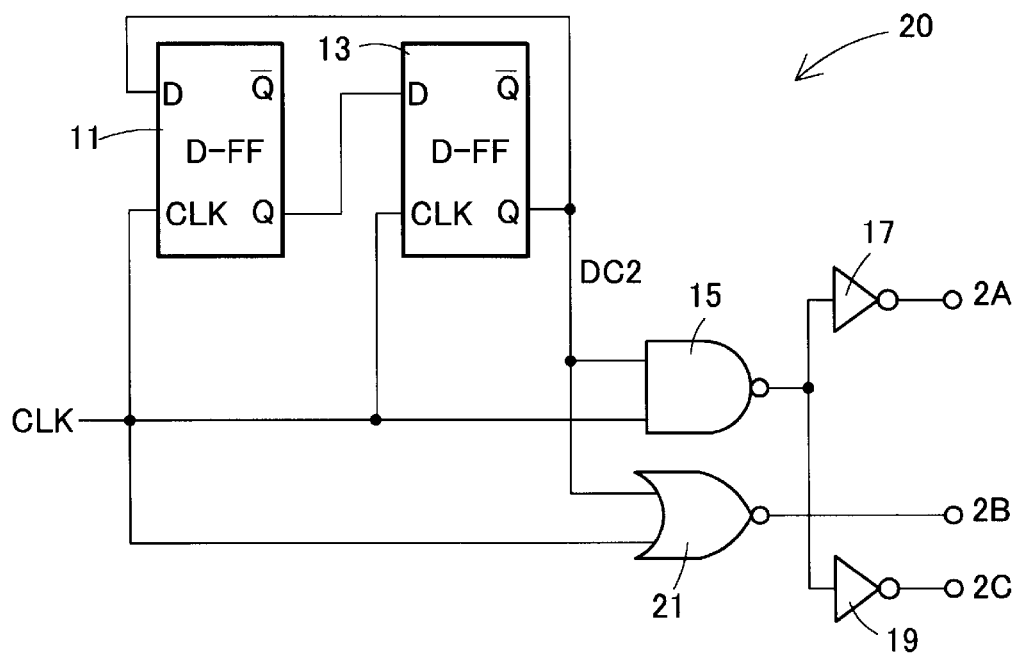
FIG. 6 is a circuit diagram showing a specific example of low-order-comparator control circuit.

FIG. 6 shows a specific example of a low-order-comparator control circuit 20. Instead of circuit structure of the high-order-comparator control circuit 10, the low-order-comparator control circuit 20 includes a NOR gate 21 to which a divided signal DC2 and a clock signal CLK are inputted. A control signal 2B is outputted from the NOR gate 21. Furthermore, control signals 2A and 2C are outputted from inverter gates 17 and 19, respectively.

FIG. 7 shows operational waveforms of the low-order-comparator control circuit 20. Control signals 2A and 2C are outputted as logic signal similar to the control signals 1A and 1C. Since a control signal 2B is an output signal from the NOR gate 21, a control signal 2B in high logic level is outputted while both a clock signal CLK and a divided signal DC2 are in low logic level. In case the low-order comparators COMP21, 22, and 23 has circuit structure such as FIG. 2, control signals 2A, 2B, and 2C control the switches SWA, SWB, and SWC, respectively, to set the switches conductive state ("ON") under high logic level condition. In FIG. 7, the low-order comparators COMP21, 22, and 23 are control under (½)-clock cycle state (I), (2/2)-clock cycle state (III).

Figure 11:
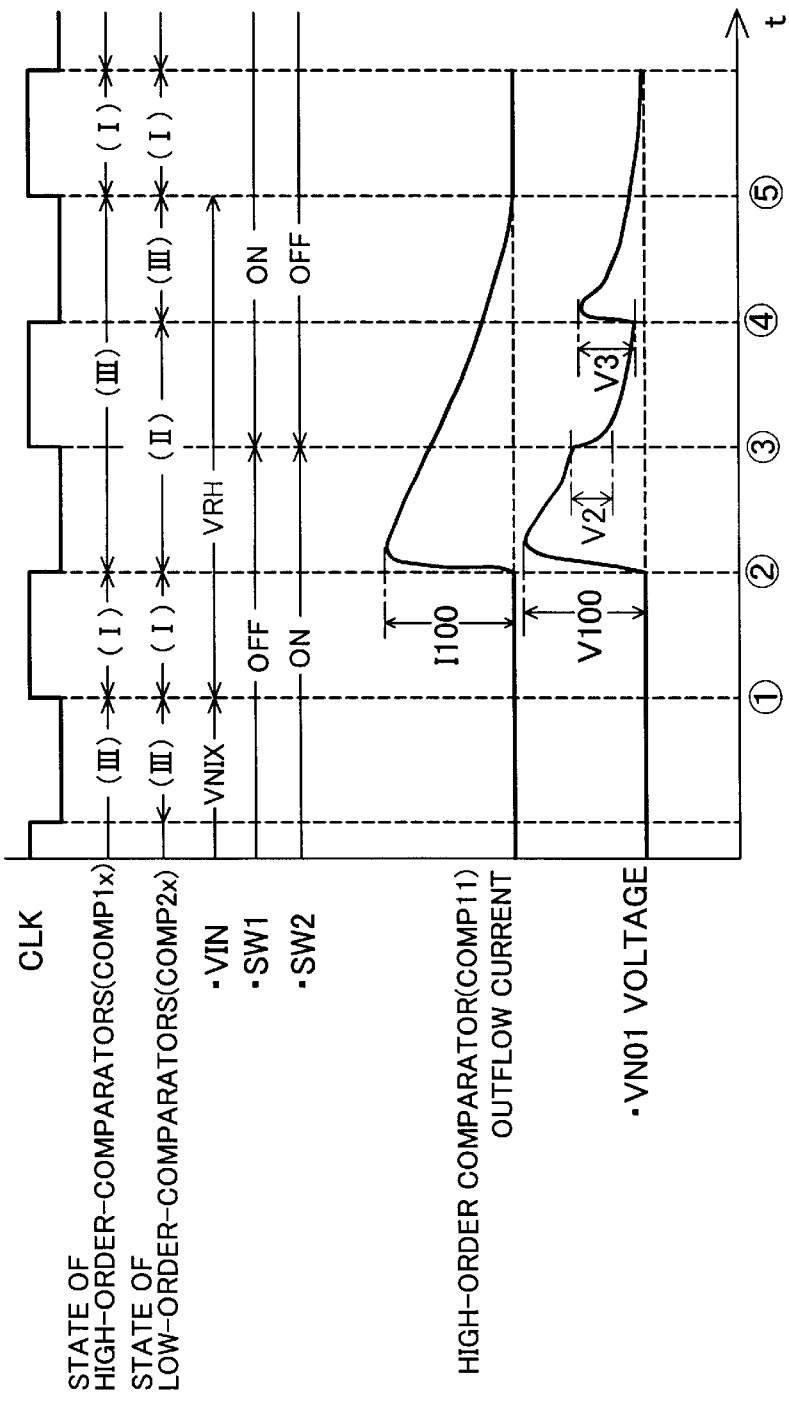
FIG. 11 shows operational waveforms of the conventional A/D converter.

FIG. 8 shows operational waveforms of the A/D converter of FIG. 1. Similar to the case of the conventional A/D converter of FIG. 11, comparators operate in synchronous with clock signals CLK. A (½) clock cycle corresponds to a unit of time step. Here, A/D conversion operation is conducted taking time step ①through ⑤ as one unit. Operation state during (I), (II), and (III) with respect to the high-order comparators COMP1x and the low-order comparators COMP2x are similar to the case or the prior art.

In the A/D converter of the present embodiment directed to FIG. 1, the first switched SW11A, SW12A, and SW13A are set conductive state at time step ①–② where fetch operation (I) is conducted to fetch analog input voltage VAIN to the high-order comparators COMP1x and the low-order comparators COMP2x. Consequently, high-order reference voltages VN1, VN2, and VN3 are supplied to the voltage holding capacitance elements C11, C12, and C13, respectively. FIG. 8 shows a case that analog input voltage VAIN was voltage level VN1X which is same as or higher than high-order reference voltage VN2 and lower than high-order reference voltage VN1, in the precedent operation cycle. That is, stored electric charges decrease due to electric charge distribution in the precedent operation cycle of voltage comparison operation (III), and a voltage value held by electric charges which are supplied to the voltage holding capacitance element C11 has lowered from a set value of high-order reference voltage VN1. As a result, voltage level of terminal voltage VC11 recovers up to the set value VN1. Since supplemental electric charges are supplied to the voltage holding capacitance element C11 from the terminals (RH) through the ladder-resistance-element array, current flows transiently in the ladder-resistance-element array that leads to the voltage-divided terminal (N1). As a result, level of reference voltage during the current flow lowers transiently.

FIG. 8 shows a case that this phenomenon occurs to low-order voltage VN01, as an example. Since the reference voltage terminal (REF) of the high-order comparator COMP11 is not charged or discharged up to high-order reference voltage VN1 during voltage comparison operation (III), a capacitance value of the voltage holding capacitance element C11 may be small. Furthermore, since quantity of electric charges to be replenished is a few, amount of peak-voltage fluctuation V1 can be set small. Accordingly, electric charges can be fully replenished to the voltage holding capacitance element C11 during time step ①–②. That is, recovery from voltage fluctuation of the low-order reference voltage VN01 at the ladder-resistance-element array, caused by charge replenishment, can be fully made during the time step ①–②.

During time step ②–③, the high-order comparator COMP 11 shifts to comparison state (operation (III)). In the present embodiment, voltage comparison operation is conducted by voltage transition due to charge distribution between the voltage-comparison capacitance element C0 or the like charged up to analog input voltage VAIN and the voltage-holding capacitance element C11 voltage level at which is charged up to the high-order reference voltage VN1. Accordingly, there is no need to charge or discharge voltage level of the reference voltage terminal (REF) at the high-order comparator COMP11 up to high-order reference voltage VN1. Therefore, outflow current from the reference voltage terminal (REF) at the high-order comparator COMP11 is significantly small peak current I1. This peak current I1 is smaller than peak current I100 (FIG. 11) directed to the prior art and able to get rid of outflow current during time step ②–③.

It should be noted that voltage level of the terminal voltage VC11 at the voltage-holding capacitance element C11 is higher than the high-order reference voltage VN1 as set value, due to charge distribution of voltage comparison operation (III). Redundant charges corresponding to a voltage value that rises from the high-order reference voltage VN1 are discharged after time ⑤, the next operation cycle. Peak-voltage-fluctuation amount V1 at this stage is a small value, too. Therefore, voltage fluctuation can be cleared within the time step ②–③.

In the prior art, the high-order reference voltages VN1, VN2, and VN3 are supplied from the ladder-resistance-element array during time step ②–③. On the other hand, in the present embodiment, the high-order reference voltages VN1, VN2, and VN3 can be supplied from the ladder-resistance-element array during time step ①–②, prior to time step ②–③, because the voltage-holding capacitance elements C11, C12, and C13 are provided therein. In addition to it, in the prior art, when the high-order reference voltages VN1, VN2, and VN3 are to be supplied, supply of electric charges is required until voltage level at the reference voltage terminal (REF) is charged or discharged up to the high-order reference voltages VN1, VN2, and VN3. On the other hand, in the present embodiment, amount of electric charges corresponding to voltage fluctuation caused by charge distribution may be replenished because voltage-holding capacitance elements C11, C12, and C13 are arranged. That is, voltage fluctuation of reference voltage at the ladder-resistance-element array never remains during time step ④–⑤ where voltage comparison operation at the low-order comparators COMP21, COMP22 and COMP23 is operated or during time step ③–④ where selection of the change-over switch groups SW1, SW2, SW3, and SW4 is conducted so as to set low-order reference voltage prior to voltage comparison operation. Accordingly, voltage comparison at the low-order comparators COMP21, COMP22 and COMP23 can be conducted accurately.

Though not shown in FIG. 8, the high-order comparators COMP12, and COMP13 conducts comparison operation in a same manner as the high-order comparator COMP11. Not to mention, terminals voltages VC12, VC13 at the voltage holding capacitance elements C12, C13, outflow current from each of the reference voltage terminals (REF) of the high-order comparators COMP12 and COMP13, and voltage fluctuation of the low-order reference voltages VN02 and VN03 or the like are in same manners as the above.

FIG. 9 show a conversion table of the A/D converter directed to FIG. 1. The analog-input voltage VAIN is divided in to sixteen voltage ranges by the ladder-resistance-element array and the sixteen voltage ranges are roughly divided into four by each of the high-order comparators COMP1x. Output signals O11, O12, and O13 from the high-order comparators COMP1x are encoded to generate high-order-two-bit digital codes. At the same time, the switch control signals S1 through S4 are controlled. Based on these switch control signals S1 through S4, one of the change-over switch groups SW1 through SW4 is selected and voltage comparison operation is conducted at each of the low-order comparators COMP2x. Thereby, the analog-input voltage VAIN divided into four is further divided into four. Output signals O21, O22, and O23 from the low-order comparators COMP2x are encoded to generate low-order-two-bit digital codes.

As described in the above, in the series-parallel A/D converter of the present invention, the high-order reference voltages VN1, VN2 and VN3 are supplied from the voltage-divided terminals N1, N2, and N3 of the ladder-resistance-element array, as high-order voltage divided terminals of resistance-component-element array, to the voltage holding capacitance elements C11, C12, and C13, respectively. After the voltage-divided terminals N1, N2, and N3 are electrically separated from the voltage holding capacitance elements C11, C12, and C13 while the voltage holding capacitance elements C11, C12, and C13 keep holding the high-order reference voltages VN1, VN2, and VN3, the high-order reference voltages VN1, VN2, and VN3 to be supplied to the high-order comparators COMP11, COMP12, and COMP13 as high-order-bit discrimination voltage comparator can be supplied from the voltage holding capacitance elements C11, C12, and C13. Accordingly, no voltage fluctuation occurs to the voltage-divided terminals N1, N2, and N3 of the ladder-resistance-element array when the high-order reference voltages VN1, VN2 and VN3 are supplied to the high-order comparators COMP11, COMP12, and COMP13. At the time of A/D conversion for low-order bits conducted subsequently, voltage fluctuation does not remain in low-order reference voltage. Accordingly, influence of A/D conversion for high-order bits can be eliminated before A/D conversion for low-order bits.

Furthermore, it is not necessary to consider relaxation time of voltage fluctuation with respect to the high-order reference voltage VN1, VN2 and VN3 at the voltage-divided terminals N1, N2, and N3 of the ladder-resistance-element array, which is due to A/D conversion operation of high-order bits. Accordingly, it is not necessary to set unnecessary relaxation time between A/D conversion of high-order bits and that of low-order bits, whereby high-speed operation of A/D converter circuit can be achieved.

Furthermore, low-order reference voltages can be supplied without influences of voltage fluctuation at the voltage-divided terminals N1, N2, and N3, which occurs when the high-order reference voltages VN1, VN2, and VN3 are supplied to the voltage-holding capacitance elements C11, C12, and C13 from the voltage-divided terminals N1, N2, and N3, respectively.

Furthermore, influence of voltage fluctuation due to A/D conversion for high-order bits can be eliminated at the time of A/D conversion for low-order bit voltage. Accordingly, voltage level of low-order reference voltage during A/D conversion for low-order bits can be set to regular set value that is free from voltage fluctuation.

Furthermore, supply operation of the high-order reference voltage VN1, VN2, and VN3 to the voltage-holding capacitance elements C11, C12, and C13, respectively, can be conducted temporarily apart from A/D conversion for low-order bits. Therefore, there never remains influence of voltage fluctuation at the voltage-divided terminals N1, N2, and N3 of the ladder-resistance-element array, which is due to supply operation the high-order reference voltages VN1, VN2, and VN3 to the voltage-holding capacitance elements C11, C12, and C13, until beginning of A/D conversion for low-order bits.

Furthermore, it is not necessary to take specific length of time to supply the high-order reference voltages VN1, VN2, and VN3 to the voltage-holding capacitance elements C11, C12, and C13, respectively. Accordingly, time for A/D conversion of high-order bits does not take longer. Thereby, the structure as such does not necessitate setting relaxation time with respect to voltage fluctuation of the high-order reference voltages VN1, VN2, and VN3 at the voltage-divided terminals N1, N2, and N3, which is caused by A/D conversion for high-order bits. Furthermore, high-speed A/D conversion operation can be achieved, as well.

Furthermore, the chopper-type comparators of the present embodiment can conduct voltage comparison operation when width of voltage transition at one terminal of a voltage-comparison capacitance element C0 reaches same as or higher than a predetermined voltage value. This predetermined voltage value may be a small voltage value because the inverter gate INV can detect the voltage. Accordingly, when the high-order reference voltage VN1, VN2, and VN3 are supplied for comparison operation, it is not necessary to charge or discharge voltage at one end of the voltage-comparison capacitance element C0 up to level of the high-order reference voltages VN1, VN2, and VN3. Instead, the voltage-holding capacitance elements C11, C12, and C13 may have capacitance values that are large enough to cause voltage transition of the predetermined voltage value by charge distribution between the voltage-comparison capacitance element C0 and the voltage-holding capacitance elements C11, C12, and C13. Amount of charges consumed at the voltage-holding capacitance elements C11, C12, and C13 may be few compared with the case that voltage at one terminal of the voltage-comparison capacitance element C0 is charged or discharged up to level of the high-order reference voltages VN1, VN2, and VN3. That is, when the high-order reference voltage VN1, VN2, and VN3 are supplied to the voltage-holding capacitance elements C11, C12, and C13, current consumption is a little and the high-order reference voltages can be supplied in a short time. Thereby, there can be achieved high-speed A/D conversion operation with low current consumption.

Furthermore, conductivity of the first switches SW11A, SW12A, and SW13A and the second switches SW11B, SW12B, and SW13B is controlled. Thereby, the high-order reference voltages VN1, VN2 and VN3 can be supplied to the voltage-holding capacitance elements C11, C12, and C13, as well as, to the high-order comparators COMP11, COMP12, and COMP13, respectively. Based on control signals 1C, 1B used for A/D conversion operation at the high-order comparators COMP11, COMP12, and COMP13, conductivity of the voltage-holding capacitance elements C11, C12, and C13 can be controlled.

Furthermore, prior to voltage comparison at the time of A/D conversion operation for high-order bits, high-order reference voltages VN1, VN2 and VN3 are supplied to the voltage-holding capacitance elements C11, C12, and C13 while high and low-order reference voltages required for A/D conversion operation of high-order bits and low-order bits are generated at the ladder-resistance-element array. Accordingly, current flowing through the ladder-resistance-element array when the high-order reference voltages VN1, VN2 and VN3 can be supplied to the voltage-holding capacitance elements in asynchronous with A/D conversion operation for low-order bit. Accordingly, voltage fluctuation of low-order reference voltages does not remain at the time to A/D conversion for low-order bits.

The present invention is not limited to the embodiment described above and may of course be improved or modified in various manners within the scope and spirit of the present invention.

For example, the present embodiment describes a case that the reference terminals of the voltage-holding capacitance elements C11, C12, and C13 are connected to ground voltage. However, the reference terminals may be connected to the terminals (RH) for supplying maximum reference voltage VRH, the terminals (RL) for supplying minimum reference voltage VRL, or power source voltage VCC of the A/D converter.

Furthermore, the present embodiment describes a case of a series-parallel A/D converter. However, type of A/D converter is not limited to series-parallel type. The aspects of the present invention are applicable to other types of A/D converter, not to mention. In this case, reference voltage generated at the ladder-resistance-element array is firstly charged to the voltage holding capacitance element. After that, the ladder-resistance-element array is separated from the voltage holding capacitance element and voltage comparison is conducted at a comparator. Accordingly, influence due to voltage comparison does not propagate to the ladder-resistance-element array.

In an A/D converter circuit directed to the present invention, transitional fluctuation of reference voltage due to comparison operation by high-order comparators does not remain until comparison operation by low-order comparators begins. Accordingly, low-order reference voltage does not fluctuate when voltage comparison operation begins. Since there is no need to await calm down of voltage fluctuation of reference voltage before comparison operation at the low-order comparator, high-speed operation of an A/D converter circuit can be realized.

What is claimed is:

1. An A/D converter circuit comprising:
one or more voltage comparators for conducting A/D conversion; and
a resistance-component-element array for generating respective reference voltage(s) for the respective voltage comparator(s) at each voltage-divided terminal of the resistance-component-element array;
wherein the A/D converter circuit further includes reference voltage holding section(s) for holding the respective reference voltage(s) supplied from each voltage-divided terminal and supplies the respective reference voltage(s) held thereat to the respective voltage comparator(s) after each of the voltage-divided terminal(s) is electrically separated from the respective reference voltage holding section(s).

2. An A/D converter circuit comprising:
one or more high-order-bit-discrimination voltage comparators for conducting A/D conversion of high-order bits prior to A/D conversion of low-order bits; and
a resistance-component-element array for generating each high-order reference voltage for A/D conversion of each of the high-order bits at each high-order-voltage-divided terminal, and each low-order reference voltage for A/D conversion of each of the low-order bits at each low-order-voltage-divided terminal, the resistance-component-element array being connected between high-voltage-side reference voltage and low-voltage-side reference voltage;
wherein the A/D converter circuit further includes each reference voltage holding section for holding each high-order reference voltage supplied from each high-order voltage-divided terminal and supplies each high-order reference voltage held thereat to each high-order-bit-discrimination voltage comparator after each high-order-voltage-divided terminal is electrically separated from the each reference voltage holding section.

3. An A/D converter circuit according to claim 2, wherein supply of the high-order reference voltage to the reference voltage holding section from the high-order-voltage-divided terminal is conducted concurrently with fetch of input voltage to the high-order-bit-discrimination voltage comparator.

4. An A/D converter circuit according to claim 3, wherein the high-order-bit-discrimination voltage comparator is chopper-type voltage comparator including a voltage-comparison capacitance element, and voltage comparison operation is conducted in a manner that firstly the input voltage is fetched to one end of the voltage-comparison capacitance element and subsequently the high-order reference voltage is fetched to another end of the voltage-comparison capacitance element, and finally the two kinds of voltages are compared.

5. An A/D converter circuit according to claim 4, wherein the reference voltage holding section includes a voltage-holding capacitance element, and the voltage comparison operation is conducted by detecting voltage transition from level of the input voltage at one terminal of the voltage-comparison capacitance element, the voltage transition occurring when the high-order reference voltage is fetched to the high-order-bit-discrimination voltage comparator(s) and electric charge is re-distributed between the voltage-comparison capacitance element and the voltage-holding capacitance element.

6. An A/D converter circuit according to claim 2, wherein the reference voltage holding section includes a voltage-holding capacitance element, and the A/D converter circuit further includes a first switching section for controlling connection between the voltage-holding capacitance element and the high-order-voltage-divided terminal, and a second switching section for controlling connection between the voltage-holding capacitance element and the high-order-bit-discrimination voltage comparator.

7. An A/D converter circuit according to claim 6, wherein connection control by the first switching section and connection control by the second switching are conducted with different timing.

8. An A/D converter circuit according to claim 6, wherein connection of the first switching section completes before supply of the low-order reference voltage to the reference voltage holding section from the low-order-voltage-divided terminal starts.

9. An A/D converter circuit according to claim 6, wherein connection of the first switching section is conducted concurrently with fetch of input voltage to the high-order-bit-discrimination voltage comparator.

10. An A/D converter circuit according to claim 6, wherein the resistance-component-element array is a ladder-resistance-element array for generating voltage divided responding to a number of output bits obtained after A/D conversion, voltage divided terminals between resistance elements constituting the ladder-resistance-element array are arranged as the high-order-voltage-divided terminal for every predetermined number of voltage-divided terminal set as the low-order-voltage-divided terminals, and current is supplied through the ladder-resistance-element array when the high-order reference voltage is supplied to the reference voltage holding section.

11. An A/D converter circuit according to claim 2, wherein supply of the high-order reference voltage to the reference voltage holding section from the high-order-voltage-divided terminal and supply of the low-order reference voltage to the reference voltage holding section from the low-order-voltage-divided terminal are conducted with different timing.

12. An A/D converter circuit according to claim 2, wherein supply of the high-order reference voltage to the reference voltage holding section from the high-order-voltage-divided terminal completes before supply of the low-order reference voltage to the reference voltage holding section from the low-order-voltage-divided terminal starts.

13. An A/D converter circuit according to claim 2, wherein the resistance-component-element array is a ladder-resistance-element array for generating voltage divided responding to a number of output bits obtained after A/D conversion, voltage divided terminals between resistance elements constituting the ladder-resistance-element array are arranged as the high-order-voltage-divided terminal for every predetermined number of voltage-divided terminal set as the low-order-voltage-divided terminals, and current is supplied through the ladder-resistance-element array when the high-order reference voltage is supplied to the reference voltage holding section.

* * * * *